United States Patent
On

[19]

[11] Patent Number: 6,138,054
[45] Date of Patent: *Oct. 24, 2000

[54] CONTROL SYSTEM EMPLOYING FIBER OPTIC COMMUNICATION LINK FOR SEMICONDUCTOR PROCESSING APPARATUS

[75] Inventor: Ching Tu On, Hsin Chu, Taiwan

[73] Assignee: Taiwan Semiconductor Manufacturing Company, Ltd, Hsin Chu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 08/971,895

[22] Filed: Nov. 17, 1997

[51] Int. Cl.$^7$ ........................................ G06F 19/00
[52] U.S. Cl. ............................... 700/121; 700/20
[58] Field of Search ..................... 438/514, 400; 250/492.21, 398; 370/466; 700/121, 143, 2, 20

[56] References Cited

U.S. PATENT DOCUMENTS

| | | | |
|---|---|---|---|
| 4,144,550 | 3/1979 | Donohue et al. | 399/77 |
| 4,754,200 | 6/1988 | Plumb et al. | 315/111.81 |
| 5,490,134 | 2/1996 | Fernandes et al. | 370/466 |
| 5,999,886 | 2/2000 | Martin et al. | 702/31 |
| 6,026,088 | 2/2000 | Martin et al. | 370/395 |
| 6,030,888 | 2/2000 | Leonardi | 438/510 |

*Primary Examiner*—William Grant
*Assistant Examiner*—Chad Rapp
*Attorney, Agent, or Firm*—Tung & Associates

[57] ABSTRACT

A semiconductor processing system, such as an ion implantation machine, includes a pair of controllers respectively disposed in high and low voltage areas of the machine, and interconnected by a fiber optic communication link. The controller located in the high voltage area employs a pair of computer processor units for respectively collecting the status of process parameters and control elements in the high voltage area, and for delivering control signals to controllable elements such as flow control valves. The controller in the low voltage area likewise employs a pair of computer processor units for generating control signals that are delivered via the fiber optic link to the first controller, and for receiving status signal information from the first controller. The fiber optic link provides high voltage isolation between the two controllers and reduces noise affecting signal accuracy.

15 Claims, 3 Drawing Sheets

CONTROL SYSTEM EMPLOYING FIBER OPTIC COMMUNICATION LINK FOR SEMICONDUCTOR PROCESSING APPARATUS

TECHNICAL FIELD

The present invention broadly relates to equipment for processing semiconductor materials, and deals more particularly with a control system employing a fiber optic communication link for connecting high voltage processing equipment with a low voltage or ground potential control station.

BACKGROUND OF THE INVENTION

A wide array of apparatus and equipment are now employed to process semiconductor substrates. Some types of equipment, such as ion implantation machines, include portions which operate at relatively high voltages, e.g., 20,000 volts up into the million volt range. Sputtering equipment and dry etchers, for example, similarly employ one or more high voltage sections which are operated or controlled from a control station which is at or near ground potential.

Because high voltage sections of such equipment present a hazard to personnel and have the potential to damage low voltage portions of the control station, the high voltage equipment is normally spaced apart and physically isolated from the control station. In many instances, the high voltage components are contained within an isolated metal housing. Control signals generated at the control station are transmitted by ordinary, specifically dedicated electrical cables to the high voltage equipment section, and monitored data within the high voltage section is likewise transmitted through dedicated, hard wire cables back to the control station. Prior systems also employ a controller, typically in the form of a PC for controlling the exchange of data and control signals between the high voltage section and the control station.

The prior art system described above suffers from a number of disadvantages. First, interconnecting the control station with the high voltage equipment section using conductive wiring increases the possibility of a short circuits, the generation of electromagnetic interference (EMI), and potential damage to sensitive, low voltage equipment in the monitoring station as a result of arc over or other high voltage shorts passing through the communication cable. Also, the prior art system was expensive to implement and was not well suited to be modified or upgraded. The number of signals carried by the conductive interconnecting cable was limited. Finally, the system lacked flexibility in that incompatibilities existing between the operating voltages used by equipment items could not be easily accommodated, but once wired to accommodate these different voltages, was difficult if not impossible to reconfigure.

The present invention is directed toward overcoming each of the deficiencies inherent in the prior art discussed above.

Accordingly, it is a primary object to provide a flexible control system employing a communication link between high voltage equipment and a control station that is at or near ground potential.

Another object of the invention is to provide a control system as described above which utilizes a fiber optic communication link to effect high voltage isolation of the control station from the high voltage equipment.

A still further object of the present invention is to provide a system as described above which employs a pair of relatively simple, inexpensive controllers respectively in the areas of the high voltage equipment and control station, which is highly flexible and adaptable to monitor and operate controllable elements operating at different voltages.

These, and further objects and advantages of the present invention will be made clear or will become apparent during the course of the following description of a preferred embodiment of the invention.

SUMMARY OF THE INVENTION

According to the present invention, apparatus is provided for controlling the operation of a semiconductor processing system, such as ion implantation machine which includes a high voltage area where high voltage operations are performed, and a physically separate low voltage, or ground potential control station for monitoring and controlling the high voltage operations. The invention includes a first controller located in the area of the high voltage operations, and a second controller located in the low voltage or control station area. The first and second controllers cooperate to monitor and control the high voltage operations. The first and second controllers are communicatively interconnected by a fiber optic link comprising a fiber optic cable having at least a pair of communication channels. The fiber optic cable provides a communication link with high voltage isolation between the first and second controllers. Each of the controllers includes first and second computer processors which send and receive digital control and status signals over the fiber optic communication link. Analog signals representing the status of various sensors and control elements in the area of the high voltage operations are multiplexed and converted from analog to digital form, and thence are transmitted by one of the computer processors over the fiber optic cable where they are received and processed by a corresponding computer processor at the control station. These latter mentioned signals representing the status of control elements or process parameters in the high voltage operations are displayed for operator viewing, or optionally may be employed in feedback control for controlling the high voltage operations. Control signals developed at the control station are converted to digital form and then transmitted by one of the computer processors over the fiber optic cable to the high voltage area where they are received by one of the computer processor units. The control signals thusly received by this fourth computer processor are converted from digital to analog form and are then employed to operate valves or other control elements used controlling process parameters, such as valves for affecting mass flow control.

BRIEF DESCRIPTION OF THE DRAWINGS

In the drawings, which form an integral part of the specification and are to be read in conjunction therewith, and wherein like reference numerals are employed to designate identical components in the various views.

DESCRIPTION OF THE PREFERRED EMBODIMENTS

Figure 1:
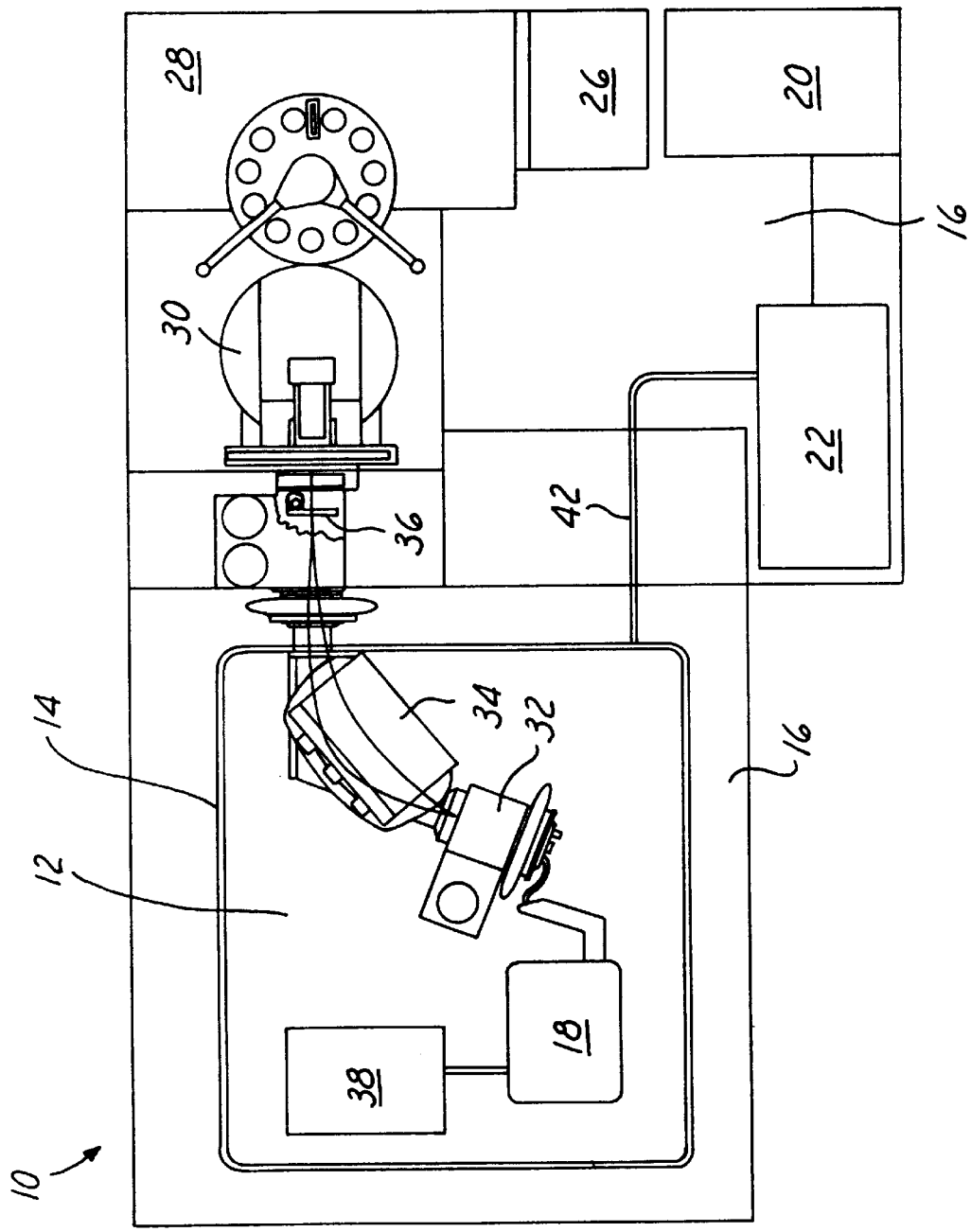
FIG. 1 is a general plan view of semiconductor processing equipment employing a control system using a fiber optic communication link which forms the preferred embodiment of the present invention.

The present invention involves improvements in the control system employed in a semiconductor processing system of the type including high voltage operations. In the embodiment illustrated herein, the control system is applied for use in an ion implantation system, generally indicated by the numeral 10 in FIG. 1. The ion implantation machine 10 broadly comprises several later discussed components disposed within a high voltage area 12, and other components located within a ground or low voltage potential area 16. As used herein, "high voltage" is understood to mean voltages on the order of 20,000 volts or more. "Low voltage" or ground as used herein refers to electronic and mechanical components of the machine, which are at or near ground potential, e.g. 0 to 24 volts. The high and low voltage areas 12, 16 are physically spaced apart somewhat to achieve high voltage isolation therebetween, but are nevertheless closely adjacent to each other within the system 10. Further isolation may be achieved by enclosing the high voltage components within a high voltage box or section 14. Isolation of the components within the high voltage area 12 from those in the low voltage area 16 is necessary in order to minimize danger to operating personnel, as well as to avoid electrical damage to components in the low voltage area 16 in the event of electrical shorts, electrical breakdown or arcing.

Components within the high voltage area 12 include a high voltage filament power supply operating at, for example, at 20,000 volts, an ion source 32, an analyzer magnet 34, and an ion source controller 18. Although not specifically shown, the ion implantation system 10 will also typically include an a remote vacuum controller accelerating column and a two dimensional scanning system. A stream of ions pass through a resolving aperture 36 past an acceleration tube, and then are introduced into a vacuum chamber 30 where the ion stream is used to bombard semiconductor substrates which are typically in wafer form and are transported into a vacuum chamber 30 for processing. As shown in FIG. 1, the vacuum chamber 30 as well as the resolving aperture 36 are located within the low voltage area 16.

Additional components of the machine 10 located within the low voltage area include an end station 28, an end station controller 26, a facility service module 22 and a beam control station 20. The end station 28 forms a part of a wafer transport system. The control station 20 operates an electrical service module 22 which in turn supplies power to the components within the high voltage area 12 by means of a high voltage power line (not shown).

Figure 2:
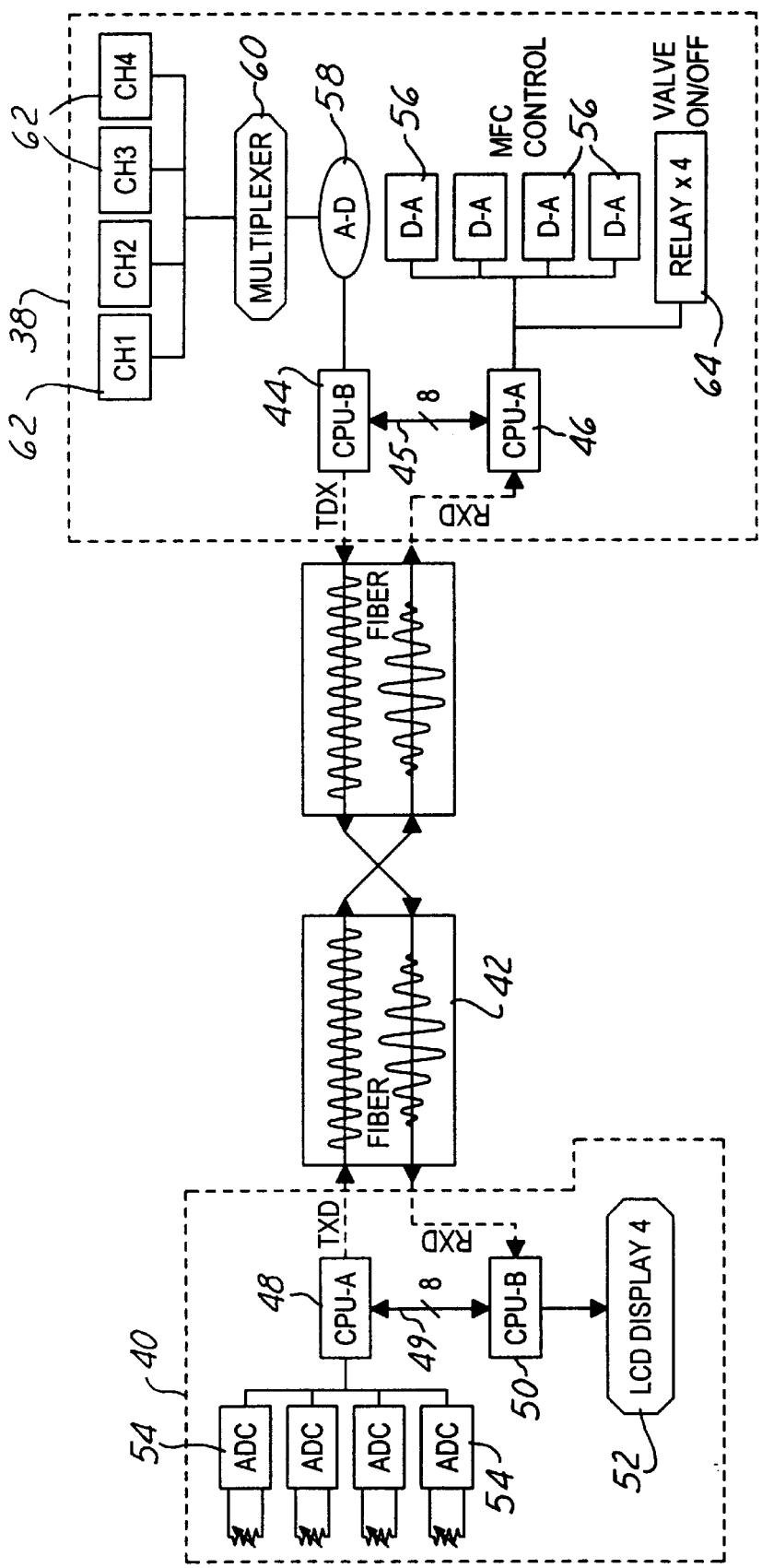
FIG. 2 is a combined block and diagrammatic view of the control system of the present invention.

Attention is also now directed to FIG. 2 which depict the details of a pair of novel controllers 38, 40 which are communicatively interconnected by the fiber optic communication link 42. Controller 38 is disposed within the high voltage area 12, and particularly within the high voltage box 14, and includes first and second computer processor units 44, 46 (CPU's) which may be, for example, 8051 processors. CPUs 44 and 46 are connected by an eight bit serial data bus 45.

The CPU 44 receives a set of digital signals from an A to D converter 58 which are related to the status and condition of various components of the equipment items located in the high voltage area 12. For example, these signals may be representative of control elements such as on/off control valves or other monitored information such as temperature, pressure, etc. These control element status signals are respectively delivered in analog form on separate channels 62 to a multiplexer 60 which outputs these status signals in multiplexed form to the A to D converter 58.

CPU 46 receives digital signals generated in controller 40 and transmitted via the fiber optic cable 42. These control signals are delivered to any of a plurality of controllable elements or components related to the control of the equipment within the high voltage area 12. In the case of some control elements, the digital signals output from CPU 46 are converted into analog form by D to A converters 56, and the analog signals are in turn employed to control various processes such as, for example, mass flow control. In other cases, the digital signals output by CPU 46 may be delivered directly to digitally controllable elements, such as the relays 64 which may control, for example, on/off valves.

It should be noted here that since the control system and communication link all operate on a common voltage, e.g. 5 volts, and are isolated from the electrical system used by the valves, relays and other control elements that are being controlled, it is not necessary change any part of the control system if it is desired to change a control element which operates on a different voltage. Thus, different ones of the control elements can operate on different voltages (e.g. 5, 10, 12, or 24 volts), without the need to modify the operating voltage of the control system. It is only necessary to change power supplies so that the correct voltage is provided to each control element.

Controller 40 located within the low voltage or ground area 16, at the control station 20 for example, includes a second pair of computer (central) processor units (CPUs) 48 and 50 which are interconnected by an eight bit serial bus 49. CPU 50 receives digital signals output from CPU 44 and transmitted via fiber optic cable 42 which are representative of or related to the condition of the control elements and process parameters of equipment items located within the high voltage area 12. CPU 50 processes these signals and displays them on a display 52 for operator viewing. In addition, the controller 40 may be employed to control all other operations of the machine 10, including ion implantation operations and transporting of the wafers between operating stations.

CPU 48 receives digital signals from A to D converters 54 whose inputs are defined by analog controls operated by a control station operator. The signals output by CPU 48 into the fiber optic cable 42 are transmitted to the CPU 46 within the high voltage area 12 and are operative to control various control elements and process parameters previously described.

It may be appreciated that the fiber optic cable part 42 forms a two channel communication link which provides high voltage and EMI isolation between the controllers 38 and 40, since the fiber optic cable 42 is essentially an insulator and has standoff voltages well into the millions of volts.

Figures 3, 4:
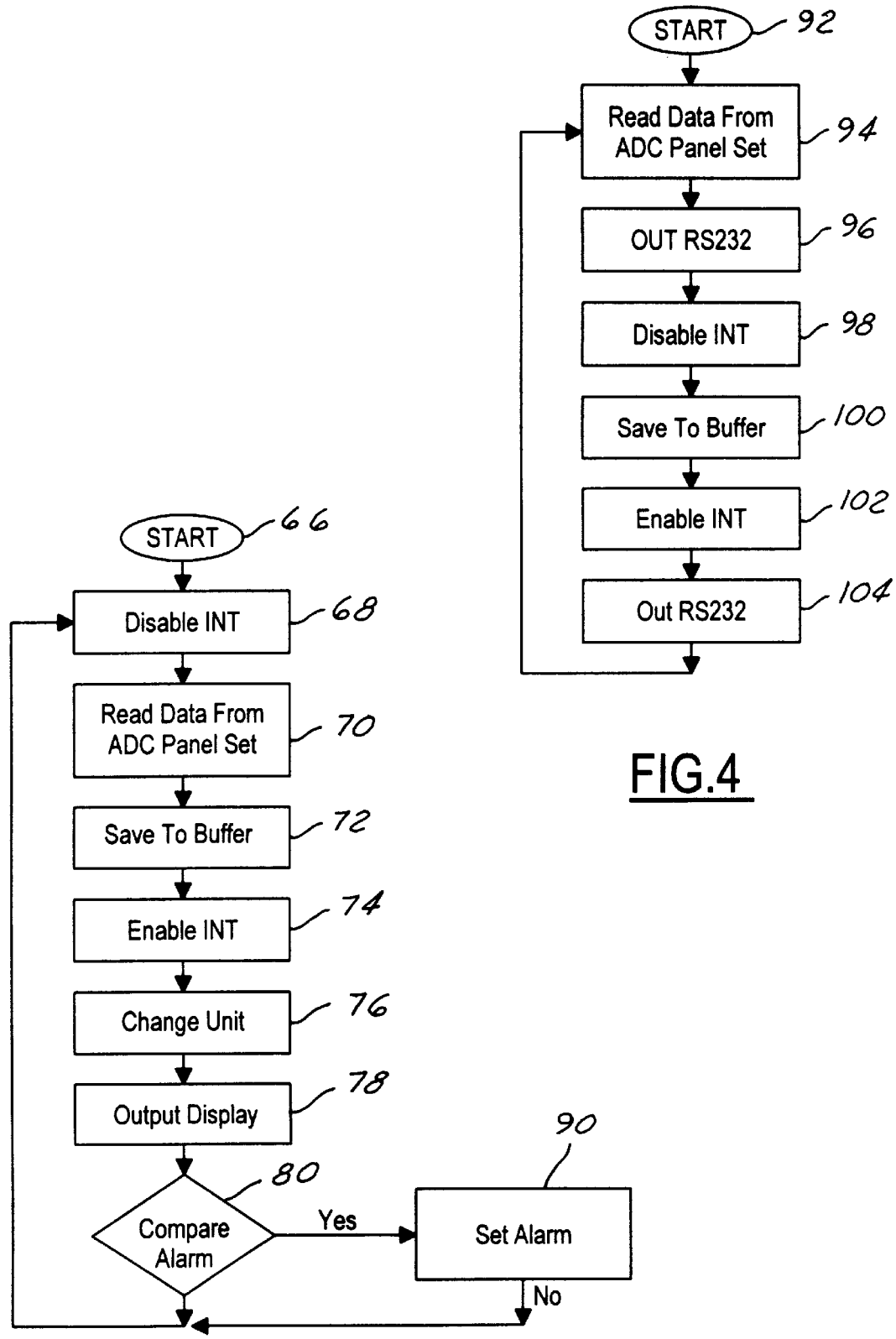
FIG. 3 is an overall, broad flow diagram of the programmed instructions used by the controller in the ground area.
FIG. 4 is an overall, broad flow diagram of the programmed instructions used by the controller in the high voltage area.

FIG. 3 is a broad flow chart for a set of programmed instructions (software) that may be employed for controlling the controller 40, and more particularly the CPUs 48 and 50. Upon start up at 66, the interrupt is disabled at 68 and data is read from the A to D converters (64 in FIG. 2) as shown at step 70. This digital data is saved in a buffer in 72, following which the interrupt is enabled at 74 and any required changes in the intended process control, as represented by the data saved in the buffer at step 72, such as a change in the mass flow rate, are then effected, and this data is displayed at 78 (on a display panel) and then compared with an alarm value at 80. The alarm value is, for example, a maximum flow rate which is set at step 90. As long as the data being compared is less than the alarm value, the interrupt signal remains disabled at 68, otherwise the alarm is reset at 90.

FIG. 4 likewise is a flow diagram showing the broad flow steps performed by a set of programmed instructions used to control the controller 38, and more particularly the CPUs 44, 46. The program starts at 92 and then reads data from the A to D converter 58 which relates to the status of the monitored process parameters and control elements. This data is output on an RF 232 communication link whereupon the interrupt is disabled at 98 and the data is saved in a buffer at 100. After the data is saved in a buffer, the interrupt signal is enabled at 102 and the data is then output on an RF 232 data link at 104. This data link corresponds to the output of CPU 44 which is connected to the optical fiber 42.

From the foregoing, it is apparent that the control system described above not only provides for the reliable accomplishment of the objects of the invention, but does so in a particularly economical and simple manner. It is recognized that those skilled in the art may make various modifications or additions to the preferred embodiment chosen to illustrate the invention without departing from the spirit and scope of the present contribution to the art. Accordingly, it is to be understood that the protection sought and to be afforded hereby should be deemed to extend to the subject matter claimed and all equivalents thereof fairly within the scope of the invention.

What is claimed is:

1. In combination:
   a semiconductor processing system having a high voltage area in which high voltage operations are performed by a plurality of control elements, and a low voltage operator control area physically separate from the high voltage area wherein the high voltage operations are monitored and controlled; and
   apparatus for controlling the operation of said semiconductor processing system, including
   (1) first controller located in the high voltage area for producing a first set of control signals controlling said high voltage operations, and a first set of status signals related to the status of said high voltage operations,
   (2) a second controller located in said operator control area for producing a second set of control signals related to the control of said high voltage operations, and a second set of signals representing said status of said high voltage operations and,
   (3) a fiber optic communication link communicatively interconnecting said first and second controllers, said fiber optic communication link providing high voltage isolation between said first and second controllers and operative to deliver said first set of control signals and said first set of status signals from said first controller to said second controller, and for delivering said second set of control signals from said second controller to said first controller.

2. The combination of claim 1, wherein said first controller includes:
   first and second computer processors for respectively producing said first set of control signals and said first set of status signals, and
   a first set of programmed instructions for controlling the operation of said first and second computer processors.

3. The combination of claim 2, wherein said second controller includes:
   third and fourth computer processors for respectively producing said second set of control signals and said second set of status signals, and
   a second set of programmed instructions for controlling the operation of said third and fourth computer processors.

4. The combination of claim 3, wherein said first controller includes a first set of digital to analog converter means coupled with said first computer processor for converting digital signals received from said first processor to analog signals used to control said control elements.

5. The combination of claim 4, wherein said first controller includes analog to digital converter means coupled with said second computer processor for converting analog signals received from said control elements indicating the status of said control elements.

6. The combination of claim 5, wherein said first controller includes a multiplexer coupled with each of said control elements for multiplexing the signals representing the status of said control elements and for delivering multiplexed signals to said analog to digital converter means.

7. The combination of claim 3, wherein said fiber optic communication link includes:
   a fiber optic cable connecting said first controller with said second controller,
   said fiber optic cable including a first communication channel between said first and third computer processors, and a second communication channel between said second and fourth computer processors.

8. The combination of claim 3, wherein said first and second computer processors are communicatively coupled with each other, and said third and fourth computer processors are communicatively coupled with each other.

9. In combination:
   an ion implantation machine including a high voltage area having high voltage equipment for producing a stream of high energy ions, and a low voltage area physically separate from said high voltage area, said low voltage area having a chamber for bombarding semiconductor substrates with said ion stream and a control station for monitoring and controlling the operation of said high voltage equipment; and
   apparatus for controlling the operation of said ion implantation machine, including
   (1) a first controller located in the high voltage area,
   (2) a second controller located in said low voltage area, said first and second controllers cooperatively communicating to monitor and control said high voltage equipment and,
   (3) fiber optic cable means coupled with and providing a high voltage isolated communications link between said first and second controllers.

10. The combination of claim 9, wherein:
    said first controller includes a first computer processor for transmitting digital signals to said second controller and representing the status of said high voltage equipment, and
    said second controller includes a second computer processor for transmitting digital signals to said first controller for controlling said high voltage equipment.

11. The combination of claim 10, wherein:
    said first controller includes a second computer processor for receiving said digital signals transmitted by said second controller, and
    said second controller includes a fourth computer processor for receiving digital signals transmitted by said first computer processor.

12. The combination of claim 9, wherein said fiber optic system includes a fiber optic cable including first and second communication channels for respectively carrying said digital signals representing the status of said high voltage equipment, and said digital signals for controlling said high voltage equipment.

13. The combination of claim 10, wherein said first controller includes a set of analog to digital converters coupled with said first computer processor for converting analog signals received from said high voltage equipment to digital signals representing the status of said equipment.

14. The combination of claim 10, wherein said first controller includes digital to analog converter means coupled with said second computer processor for converting digital signals received from said second controller to analog signals used to control said high voltage equipment.

15. The combination of claim 10, wherein said first controller includes a multiplexer for multiplexing signals representing the status of said high voltage equipment and delivering multiplexed signals to said analog to digital converter means.

* * * * *